United States Patent [19]

Anderson et al.

[11] Patent Number: 4,804,311
[45] Date of Patent: Feb. 14, 1989

[54] TRANSVERSE DIRECTIONAL SOLIDIFICATION OF METAL SINGLE CRYSTAL ARTICLES

[75] Inventors: Neal P. Anderson, Broad Brook; Anthony F. Giamei, Middletown; Richard W. Salkeld, South Windsor, all of Conn.

[73] Assignee: United Technologies Corporation, Hartford, Conn.

[21] Appl. No.: 330,911

[22] Filed: Dec. 14, 1981

[51] Int. Cl.[4] .......................... F01D 1/02; B22D 15/00
[52] U.S. Cl. ..................................... 415/191; 164/127; 164/122.2
[58] Field of Search .................. 164/122.1, 122.2, 125, 164/127, 361; 415/191; 416/191, 241 R

[56] References Cited
U.S. PATENT DOCUMENTS 3,260,505  7/1966  VerSnyder ........................... 416/179
3,494,709  2/1970  Piearcey .............................. 416/232
3,542,120  11/1970  Piearcey .............................. 164/361
3,568,757  3/1971  Piearcey .............................. 164/353
3,598,169  8/1971  Copley et al. ..................... 164/122.1
4,008,052  2/1977  Vishnevsky .......................... 29/194
4,116,723  9/1978  Gell et al. ............................... 148/3
4,190,094  2/1980  Giamei ............................. 164/122.1
4,209,348  6/1980  Duhl et al. ............................... 148/3

Primary Examiner—Timothy V. Eley
Attorney, Agent, or Firm—C. G. Nessler

[57] ABSTRACT

During conventional directional solidification of a single crystal article having a large overhanging flange lying along its length, crystal nucleation defects and shrinkage occur in the flange. To form articles without such defects, the part is cast so that the solidification front moves transverse to the length of the article, and essentially parallel to the flange surfaces where the defects tend to occur. The solidification front is initiated at a seed crystal oriented to produce the desired crystal structure in the cast article. Dendritic effects produce somewhat different properties in articles cast in accord with the invention, compared to those cast with prior art techniques.

9 Claims, 4 Drawing Sheets

TRANSVERSE DIRECTIONAL SOLIDIFICATION OF METAL SINGLE CRYSTAL ARTICLES

DESCRIPTION

1. Technical Field

The present invention relates to the process of directional solidification, particularly to the directional solidification of single crystal parts having large changes in section size, such as gas turbine vanes.

2. Background Art

In the directional solidification casting process, a solidification front is moved through molten metal in a mold, to progressively solidify a part. Both columnar grain and single crystal parts may be produced. The process has been found especially useful in making improved superalloy rotor blades and stator vanes for gas turbines.

The basic process of directionally solidifying turbine blades is disclosed by VerSnyder in U.S. Pat. No. 3,260,505. Piearcey, in U.S. Pat. Nos. 3,494,709 and 3,542,120 discloses turbine blades made with a single crystal structure and their methods of manufacture. Generally, a desired single crystal growth structure is created at the base of a vertically disposed mold defining a part, and the single crystal solidification front is propagated through the structure under the influence of a moving thermal gradient.

Most of the technology in the field has been directed at forming blades which rotate at high speeds. Generally, the blades are suited to directional solidification processes since they tend to be relatively long and narrow. Blades are usually comprised of an airfoil section attached to a larger root. Occasionally, they have lateral portions or shrouds at the airfoil tip. When a solidification front moves vertically through a blade, from the root to a tip having a shroud, the crystal must grow laterally into the shroud, i.e., perpendicular to the direction of the thermal gradient. In addition, the vertical solidification dynamics are altered whenever a solidification front encounters a section size change. See U.S. Pat. No. 4,190,094 to Giamei. Since shrouds in blades tend to extend laterally relatively short distances, the foregoing factors do not cause unacceptable defects in the final blade article, when it is solidified by moving the front along the longitudinal or z axis.

Vanes, which are static in use and subjected to lower stresses, are somewhat more difficult to cast. Compared to blades, they have more prominent shrouds (more often, called platforms, or endwalls), usually at both ends of the airfoil section. In some advanced gas turbines, the platforms tend to become especially large in lateral extension, thereby greatly increasing the difficulties of directional solidification in these regions. When uniform directional solidification is not maintained at platforms then there will be extraneous grain nucleation. That is, the article will not be a single crystal because the epitaxial solidification of the moving front will not proceed laterally fast enough. The moving thermal gradient which is the driving force of the solidification front will instead cause cooling in the platform, sufficient to cause crystallization of a new grain.

Superalloys specifically tailored for single crystal articles have been developed. They have substantially better properties than prior alloys, in part because elements which previously provided strength to grain boundaries have been removed. See U.S. Pat. No. 4,209,348 to Duhl et al. Thus, when extraneous nucleation takes place in articles made from single crystal alloys, low strength grain boundaries can make the article inadequate.

SUMMARY OF THE INVENTION

An object of the invention is to provide an improved method for soundly casting single crystal gas turbine vanes and other articles having large flanges on either end of a relatively small cross section body.

According to the invention, a single crystal article, having orthogonal x, y, and z axes and comprised of a body part lying along the z axis with an overhanging flange, is solidified by moving a solidification front through the article in a direction transverse to its longitudinal z axis. That is, the direction of solidification is essentially parallel to the surface of the flange where the crystal defects occur when conventional solidification is used. When the article is in the shape of a gas turbine vane, the body is an airfoil, and the solidification front is caused to move from one airfoil edge to the opposing edge. In most instances, solidification is initiated from a seed crystal. The seed will be oriented so that the crystal orientation desired along the article z axis will lie parallel to the z axis.

Articles formed by the method of the invention will have shapes which are not easily solidified by progressively moving a solidification front along the z axis. Experiment shows that these will be articles where the flange extends transversely a distance L from the nearest abutting body portion, where the adjacent flange and body surfaces form an angle A, and where L is greater than $$L(\max) = \frac{5A}{2(180° - A)}$$

where A is in degrees between 70°–120° and L is in centimeters.

Articles made in the practice of the invention will have improved crystallographic structure and less shrinkage. However, because there is anisotropy from dendritic growth orientation, the articles will have different properties, even though crystallographically they may be the same as articles made according to the prior art.

Other features and advantages will be apparent from the specification and claims and from the accompanying drawings which illustrate an embodiment of the invention.

BEST MODE FOR CARRYING OUT THE INVENTION

The preferred embodiment of the invention is described in terms of casting of a superalloy vane for a gas turbine engine, but the invention will be generally useful with other kinds of articles and metals as well.

Figure 1:
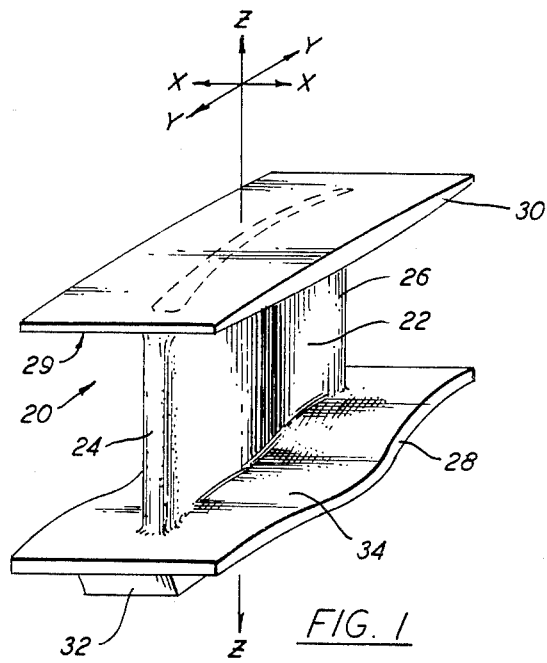
FIG. 1 shows a gas turbine vane with large overhanging platforms.

As shown in FIG. 1, a vane 20 for a gas turbine engine is comprised of an airfoil shaped body portion 22 having a leading edge 24 and a relatively thin trailing edge 26. The vane, according to common convention is fitted with orthogonal x, y, and z axes. At either end of the body 22 are platforms 28, 30. These are relatively thin flange-like structures which extend transversely to the body length, essentially in the x-y plane. The typical vane shown in FIG. 1 has a heavier root portion 32 at one end which enables it to be easily mounted in the gas turbine engine. The opposing surfaces 29, 34 of the opposing platforms 28, 30 usually have precise contours and good finish, to channel gases.

Figure 2:
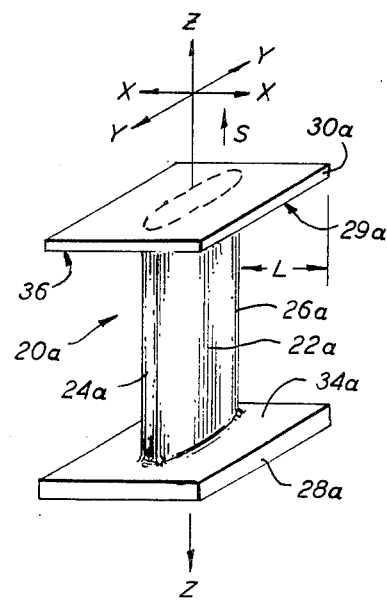
FIG. 2 shows a simplified article analogous to the vane of FIG. 1.

FIG. 2 shows a simpler article 20a which is simulative of the vane in FIG. 1, and other structures to which the invention will be found applicable. An oblong body portion 22a lies along the z axis. It has a front edge 24a and an opposing rear edge 26a. At the lower end of the body is a first flange 28a; at the opposing end is a second flange 30a. The article has x, y, and z axes. According to the teachings of the prior art, the normal way an article such as shown in FIG. 2 would be cast would be to form a mold having a portion of substantially the same shape as the part. The mold is filled with molten metal, and a thermal gradient established which causes a solidification front (the mean contour between the liquidus and solidus interfaces, also called the solidification interface) to move along the z axis from the first flange 28a through the body, to the second flange end. For parts with flanges as shown in FIG. 2, this would result in two problems: first, there would be shrinkage at the surface 34a of the first flange 28a, due to the normal shrinkage which occurs during the solidification metals in the absence of gating for supplying molten metal. Second, there would be a tendency for extraneous crystal nucleation at locations, such as 36, on the underside of the upper flange 30a. Grains nucleated in this area would then propagate vertically upward along the z axis, through the thickness of the flange.

According to the prior art, the method used to decrease the shrinkage in the region 34 is to provide gates. However, after casting such gates must be removed by machining, to form the final article. This introduces likelihood of dimensional deviation and additional cost. The elimination of extraneous nucleation at the location 36 is more difficult. Basically, the problem is that the solidification front is moving along the z axis, while the requirements in the vicinity of the flange 30a are that the crystal growth take place laterally, transverse to the direction of the thermal gradient motion which is inherently associated with the solidification front movement. If the crystal does not grow laterally at a sufficiently fast rate, the moving thermal gradient will produce cooling at the remote location 36, sufficient to cause self-nucleation in the metal. In all probability this will not correspond with the epitaxy of the moving front, and a separate grain and grain boundary result. It is worthy of note that many articles such as gas turbine blades, have only one laterally extending flange-like structure. If the lateral extension is not too great, then it is often a practice to eliminate the shrinkage by casting the part "upside down", that is, so that the solidification front first moves through the body, and then into the flange region. This is successful because it is observed that single crystals of superalloys will grow laterally, notwithstanding the physics of the process mentioned above, if the flange extension and angle with the body, as discussed further below, are not too severe. However, this technique does not work if the flange extends laterally too great a distance, or when there are two opposing flanges such as in the article of FIG. 2. The thickness (z axis length) of the flanges, as will be understood from the phenomena which cause problems, is not determinative in avoiding or overcoming the problem. Thus, in this application, the characterization "flange" will be taken as a reference to a portion of an article which extends transverse to another body, regardless of its z axis thickness.

Figure 3:
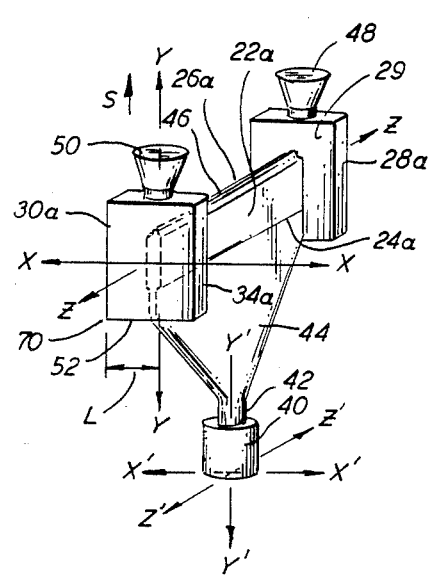
FIG. 3 shows how gating is connected to the article of FIG. 2 in the practice of the invention.

The practice of our invention is illustrated by FIG. 3 which shows the article of FIG. 2 with its entire gating system attached. It will be recognized instantly that this is the shape of the internal contour of the mold in which the assembly is cast. Of course, it will also be recognized that additional gating may be used on more complex parts, or on the present part, as the elimination of localized shrinkage dictates. The gating starts from a seed cavity 40 to which is attached a single crystal selector section, straight channel 42. The gating then expands in a transition or growth section 44, connecting to the edge 24a and the surfaces 29, 34a of platforms 28a, 30a. At the other (upper) edge 26a of the body there is another gate 46, to eliminate local shrinkage. At the most vertical portion of the flanges 28a, 30a there are risers 48, 50. The axes of the part are shown superimposed on the drawing and, as represented by the arrow S, the solidification front moves along the y axis. The seed 40, from which the entire casting is epitaxially solidified, must have a crystallographic orientation which corresponds with that desired in the part comprised of the body and the end flanges. Thus, the seed axes x', y', and z' have a crystallographic orientation which corresponded with those sought in the article. In many instances, only the z axis orientation of the article is of interest, and for these, the only orientation axis of interest in the seed would be the z' axis. It is seen that the solidification in the body takes place readily from the transition section. With respect to the end flanges 28a, 30a, as typified by end 30a, it is seen that the transition gate 44 intercepts the flange at its bottom 52. (Thus, there is a new and smaller lateral distance L to point 70, toward which the crystal must grow.)

Figure 4:
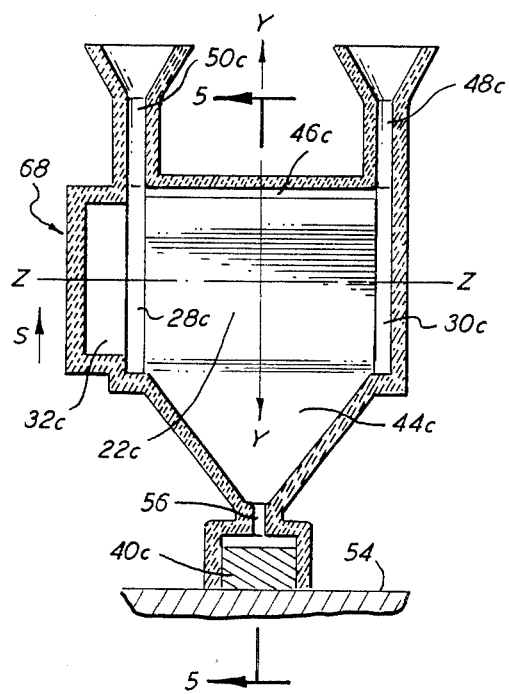
FIG. 4 shows in cross section a mold for casting the vane of FIG. 1, with gating analogous to that shown in FIG. 3.
Figure 5:
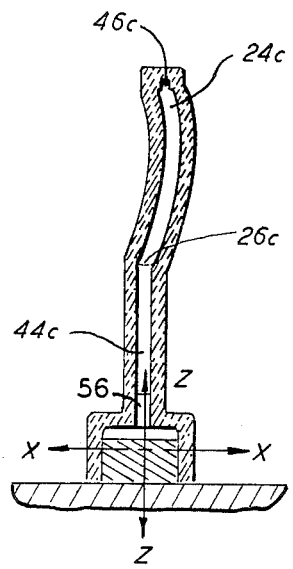
FIG. 5 is a partial side view of the mold shown in FIG. 4.

FIGS. 4 and 5 show how the invention is applied to the vane shown in FIG. 1. The Figures show a ceramic mold ready for the introduction of molten superalloy. The mold 68 has parts which define the article, namely cavities 22c, 28c, 32c and 30c, where the numbers correspond to those without the suffix on FIG. 1. At the very base of the mold is a seed 40c resting on a chill plate 54. Immediately above the seed is a narrow passage 56 which aids in the formation of a unitary single crystal solidification front in the transition region 44, moving transverse to the z axis. The front will then pass through the cavity defining the vane and into the risers 48c, 50c.

FIG. 5 shows in cross section how the transition section 44c is connected to the trailing edge section 26c. Also shown is the upper gate 46c, to eliminate shrinkage at the leading edge region 24c. After molten metal is poured into the mold and the solidification front is caused to pass through the mold, the cast assembly is removed from the furnace. The ceramic material is the disposed of and all the gating cut from the desired casting.

A seed is used whenever the crystal orientation desired along the z axis is not that which would occur naturally in its absence, or whenever the orientation of crystal axes must be controlled in x-y directions. In those instances where the natural cast metal orientation is adequate, then a single crystal selector, generally along the lines shown in U.S. Pat. Nos. 3,536,121 and 4,111,252 may be used.

The invention will be useful with various methods of directional solidification including those in U.S. Pat. Nos. 3,124,452, 3,260,505, 3,494,709, 3,536,121, 3,714,977 and 3,763,926, the disclosures of which are hereby incorporated by reference.

Figure 6:
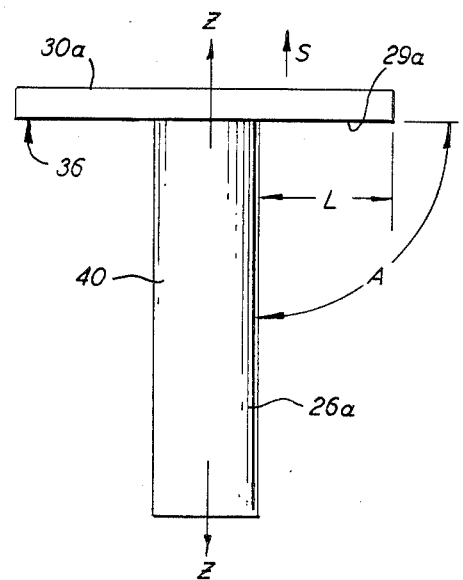
FIG. 6 is a side view of the upper portion of the article of FIG. 1.
Figure 7:
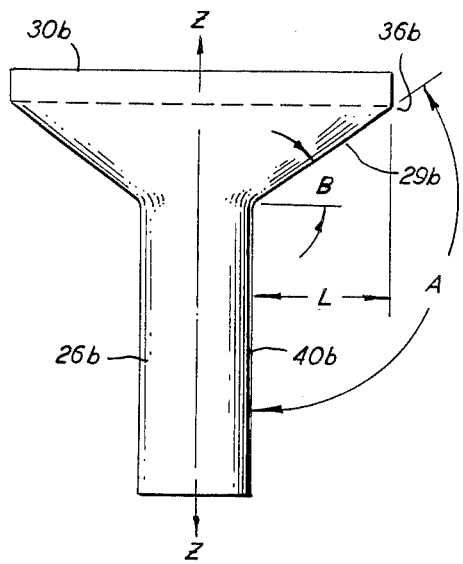
FIGS. 7–10 are side views similar to that in FIG. 6, but of other articles.
Figure 8:
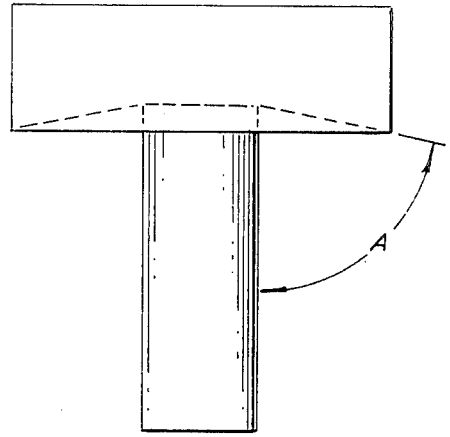

FIGS. 6–10 further illustrate the problem solved and the applicability of the invention. FIG. 6 is a side view of the upper flange 30a of the article shown in FIG. 2. FIGS. 7–10 are similar views of other like articles having somewhat different geometry. Referring to FIG. 6, it is seen that the flange extends a distance L from the body and that its lower surface 29a, disposed toward the body, forms an angle A with the z axis (or adjacent co-aligned surface 40) of the body. In FIG. 6 the angle A is nominally 90°. FIG. 7 shows another body where the angle A is greater than 90°, and FIG. 8 shows a body where the angle A is less than 90°. Referring to FIG. 7, it is seen that the surface 29b is sloped in the direction in which solidification could proceed, moving from the body to the larger cross section flange, along the axis. The angle B, which is 90° less than the angle A, is often referred to as the ramp angle.

Empirical limits define when extraneous nucleation takes place in superalloy parts solidified in thin ceramic molds using radiation cooling, such as the so-called high rate solidification techniques (i.e., where there is relative motion of the molten metal filled mold and heat source, so the mold moves progressively into a cold zone where it loses its heat by radiation). When the solidification front is proceeding along the z axis, from the body toward a flange, it is generally found for angle B greater than about 30° (angle A about 120° or greater), there will not be a problem with extraneous nucleation at locations 36, 36b, due to the lateral displacement of the location, regardless of L. The crystal growth in the x-y plane direction will be sufficient as the solidification front progresses along the z axis, to avoid extraneous nucleation. Thus, parts having A of less than 120° are those to which the invention is applied in preference to the prior art technique.

The lateral extension L, shown in FIGS. 6, 7, 9 and 10, is a measure of the distance by which the flange overhangs the most proximate portion of the body, namely its surface 40. Even when the angle A is 90° or slightly less it is found that so long as the distance L is less than about 2.5 centimeters, the lateral crystal growth will be sufficient, compared to the typical thermal gradient motion, that extraneous nucleation in regions 36, or closer, is avoided.

An empirical relationship has been developed between L and A, valid for angles A between 70 and 120 degrees, to establish when the invention should be used; viz., when L exceeds, $$L(\max) = \frac{5A}{2(180° - A)}$$

where A, in degrees, is the nominal angle between a z axis within the body, and a line of crystal growth to a point in a flange connected to the body; and where L, in centimeters, is the perpendicular distance from the z axis to the point. For A greater than 120° the invention is not needed. For A less than about 70° the formula is not pertinent, and the invention should be used for all instances. As an example of the use of the invention, when A is 90°, L(max) is 2.5 cm. Thus, when L is 2 cm the prior art method is usable; when L is 3 cm our method will be used. When the abutting surfaces of the flange and body are curved, the angle A will be measured according to the angle between lines tangent to the surfaces, the lines lying in a plane containing the z axis.

Figure 9:
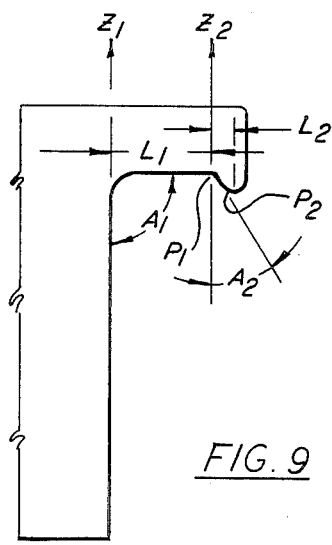
Figure 10:
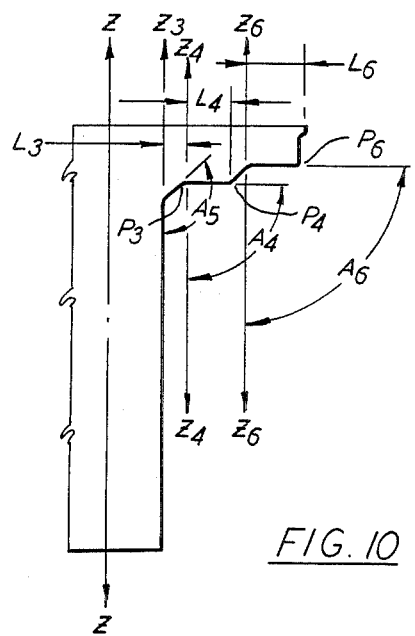

FIGS. 9 and 10 illustrate how $L_n$ and $A_n$ are measured in representative irregular bodies. Essentially, $A_n$ and $L_n$ are measured from the proximate location at which vertical z axis direction crystal growth takes place, to the "line of sight" distant point $P_n$. Thus, complex lateral paths are viewed as a series of subsets.

Our invention will be found applicable to bodies where the foregoing L(max) conditions are violated. Practical experience shows the invention is used to form articles where L is greater than 2.5 centimeters and A is less than 105°. Of course, there is no reason that the invention may not be applied to casting of articles not meeting the foregoing criterion. However, we believe that the prior art techniques will be more appropriate and will require less finishing of the cast article than will the use of our invention.

The following is an example of the practice of the invention. A face centered cubic alloy, of a composition described in U.S. Pat. No. 4,209,348, is directionally solidified into the shape of a gas turbine vane, like that shown in FIG. 1. The design of the part requires that the [001] crystal axis lie along the z axis of the part. Therefore, a seed is prepared separately; it is machined and positioned in the seed cavity of the mold so that the [001] crystal axis lies along the z' axis, as shown in FIG. 3, and the [100] crystal axis lies along the y' axis. Epitaxial solidification takes place from the seed, by growth in the [100] crystallographic direction, along the y' axis (which is co-aligned with the y axis).

Figure 11:
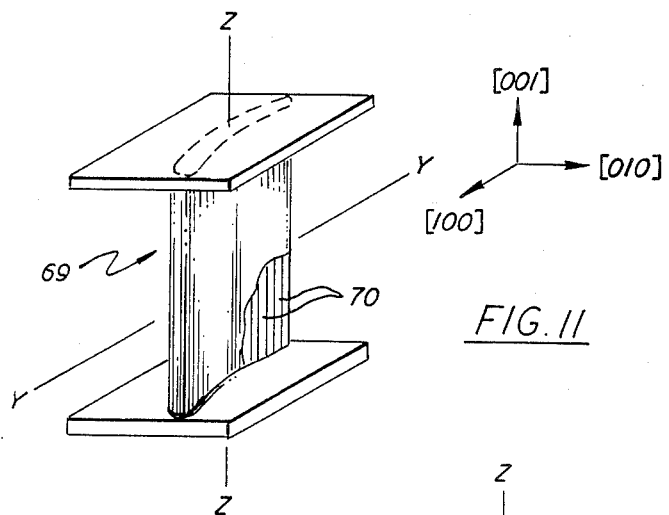
FIG. 11 illustrates the metallurgical structure of an article solidified in accord with the prior art.
Figure 12:
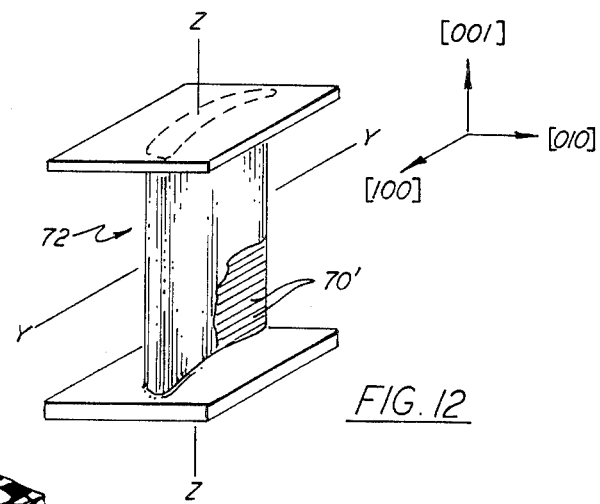
FIG. 12 illustrates the metallurgical structure of an article solidified in accord with the invention.

After the part is removed from the mold, it is examined metallographically. It is found that the [100] crystal axis growth has produced a dendritic alignment which is somewhat different from a part cast in accord with the prior art, where [001] crystal axis growth takes place along the z axis. This is illustrated by FIGS. 11 and 12. Primary dendritic growth direction is indicated by columns 70, 70'. In FIG. 11, a conventional single crystal cast part 69 has been solidified by [001] crystal growth along the z axis. The primary dendrites 70 formed as the solidification front moved through the part. They are continuous and are aligned with the z axis. In contrast, FIG. 12 shows a part 72 cast in accord with the example above. It has an alignment of dentrites 70' along the y axis.

Figure 13:
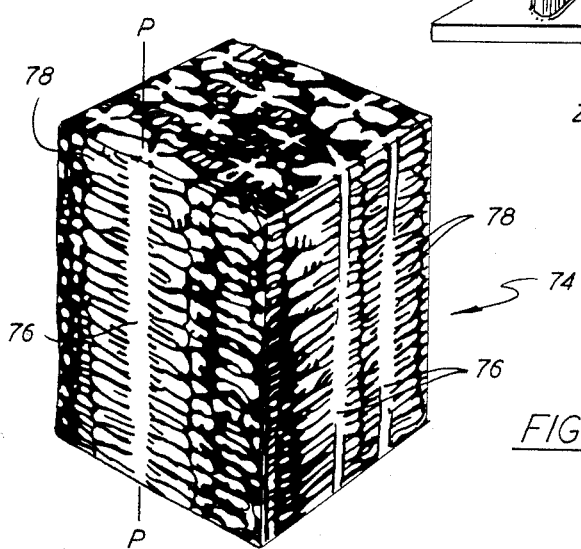
FIG. 13 shows dendrites which comprise the metallurgical structure of FIGS. 11 and 12.

The cause of a property difference between identical cube axes can be understood by referring to FIG. 13 which shows in more detail dendrites 74 which have grown along an axis p-p. They are comprised of large primary spaced apart structures 76 and small branch-like structures 78. FIG. 2 of U.S. Pat. No. 4,116,723 illustrates the dendrite scale, in showing dendrites in metallographic cross section transverse to the line p-p of FIG. 13 herein. Because of the effect of dendrite orientation and size, and the metallurgy of interdendritic spaces, properties along the length of a part aligned with the primary dendrites will be greater than transverse thereto. The difference between transverse and longitudinal properties will be dependent on alloy composition, but it is not unusual for the transverse strength to be less than 50% of the longitudinal strength, along identical cubic crystal orientations. Thus, the article of FIG. 12 will have different mechanical properties than the article of FIG. 11.

Although this invention has been shown and described with respect to a preferred embodiment, it will be understood by those skilled in the art that various changes in form and detail thereof may be made without departing from the spirit and scope of the claimed invention.

We claim:

1. A single crystal article having orthogonal x, y and z axes and having a body lying along the z axis and a flange lying at an angle thereto, the flange and the body having abutting surfaces intersecting with an angle A between 70°–120°; the flange containing a point located a perpendicular distance L from the nearest z axis surface of the body, the distance L in centimeters being greater than $$L - (max) = \frac{5A}{2(180° - A)}$$

wherein A is in degrees; the article made by directional solidification using a seed, wherein a solidification front initiated at the second is caused to form the part by moving through the article transverse to the z axis.

2. The article of claim 1 having two opposing flanges spaced apart along the body.

3. The article of claim 2 having the shape of a vane for a gas turbine engine.

4. The article of claim 1 comprised of a face centered cubic crystal structure superalloy, with a crystallographic orientation of [001] along the z axis.

5. The article of claim 1 where L is at least 2.5 centimeters and A is less than about 105°.

6. The method of directionally solidifying as a single crystal structure an article having orthogonal x, y and z axes wherein the article is comprised of a body part and a flange part, the body lying along the z axis and the flange lying at an angle thereto, the flange and the body having abutting surfaces intersecting with an angle A between 70°–120°; the flange containing a point located a perpendicular distance L from the nearest z axis surface of the body, the distance L in centimeters being greater than $$L(max) = \frac{5A}{2(180° - A)}$$

wherein A is in degrees; characterized by initiating a solidification front at a seed and moving the front through the article in a direction transverse to the z axis, the seed providing in the solidified article a desired crystallographic orientation with respect to the z axis.

7. The method of claim 6 characterized in that the article has two opposing flanges, spaced apart along the body.

8. The method of claim 5 characterized in that the article is a vane for a gas turbine engine, the body shaped as an airfoil with leading and trailing edges, the front moving from one edge of the airfoil, to the opposing edge.

9. The method of claim 6 characterized by an article comprised of a face centered cubic crystal structure superalloy, with a desired crystallographic orientation of [001] along the z axis, the seed having a [001] crystal axis lying parallel to the z axis.

* * * * *

UNITED STATES PATENT AND TRADEMARK OFFICE
CERTIFICATE OF CORRECTION

PATENT NO. : 4,804,311

DATED : February 14, 1989

INVENTOR(S) : Neal P. Anderson et al

It is certified that error appears in the above-identified patent and that said Letters Patent is hereby corrected as shown below:

Claim 1, column 7, line 41, "second" should be --seed--

Signed and Sealed this

Twenty-fifth Day of July, 1989

Attest:

DONALD J. QUIGG

Attesting Officer

Commissioner of Patents and Trademarks